US006975977B2

(12) United States Patent
Gauthier et al.

(10) Patent No.: US 6,975,977 B2
(45) Date of Patent: Dec. 13, 2005

(54) LOW-COMPLEXITY, HIGH ACCURACY MODEL OF A CPU ANTI-RESONANCE SYSTEM

(75) Inventors: Claude R. Gauthier, Fremont, CA (US); Brian W. Amick, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 765 days.

(21) Appl. No.: 09/819,198

(22) Filed: Mar. 28, 2001

(65) Prior Publication Data

US 2002/0143509 A1    Oct. 3, 2002

(51) Int. Cl.[7] ............................................. G06F 17/50
(52) U.S. Cl. ..................... 703/14; 343/722; 327/158; 716/18
(58) Field of Search ................... 318/814; 704/218; 327/158; 331/135, 117; 716/18; 84/624; 703/14, 18; 388/814; 343/722; 323/282

(56) References Cited

U.S. PATENT DOCUMENTS

| | | | | |
|---|---|---|---|---|
| 3,808,370 A | * | 4/1974 | Jackson et al. | 704/218 |
| 4,290,036 A | * | 9/1981 | Moulding et al. | 333/215 |
| 4,459,566 A | * | 7/1984 | Lane | 331/135 |
| 4,746,879 A | * | 5/1988 | Ma et al. | 331/44 |
| 4,810,922 A | * | 3/1989 | Hirsch | 310/316.01 |
| 4,949,055 A | * | 8/1990 | Leitl | 331/158 |
| 5,223,653 A | * | 6/1993 | Kunimoto et al. | 84/624 |
| 5,340,942 A | * | 8/1994 | Kunimoto | 84/661 |
| 5,412,349 A | | 5/1995 | Young et al. | 331/34 |
| 5,513,090 A | * | 4/1996 | Bhattacharya et al. | 363/40 |
| 5,731,965 A | * | 3/1998 | Cheng et al. | 363/41 |
| 5,761,479 A | * | 6/1998 | Huang et al. | 710/301 |
| 6,075,491 A | * | 6/2000 | Dakeya et al. | 343/722 |
| 6,104,255 A | * | 8/2000 | Goma et al. | 331/117 D |
| 6,110,219 A | * | 8/2000 | Jiang | 716/1 |
| 6,188,366 B1 | * | 2/2001 | Yamamoto et al. | 343/722 |
| 6,240,246 B1 | * | 5/2001 | Evans | 388/814 |
| 6,370,678 B1 | * | 4/2002 | Culler | 716/18 |
| 6,396,316 B1 | * | 5/2002 | Cruz et al. | 327/112 |
| 6,429,632 B1 | * | 8/2002 | Forbes et al. | 323/282 |
| 6,441,640 B1 | * | 8/2002 | Gauthier et al. | 326/30 |
| 6,456,107 B1 | * | 9/2002 | Gauthier et al. | 326/27 |
| 6,483,341 B2 | * | 11/2002 | Gauthier et al. | 326/30 |
| 6,501,328 B1 | * | 12/2002 | Gauthier et al. | 327/551 |
| 6,571,184 B2 | * | 5/2003 | Anderson et al. | 702/65 |
| 6,781,355 B2 | * | 8/2004 | Gauthier et al. | 323/233 |
| 6,789,241 B2 | * | 9/2004 | Anderson et al. | 716/5 |
| 6,842,351 B2 | * | 1/2005 | Gauthier et al. | 363/39 |
| 6,850,878 B2 | * | 2/2005 | Smith et al. | 703/18 |
| 2001/0020876 A1 | * | 9/2001 | Tsukagoshi et al. | 331/158 |
| 2002/0011885 A1 | * | 1/2002 | Ogawa et al. | 327/158 |
| 2002/0089347 A1 | * | 7/2002 | Gauthier et al. | 326/30 |
| 2002/0143509 A1 | * | 10/2002 | Gauthier et al. | 703/14 |

OTHER PUBLICATIONS

Bathey et al., "Resonance analysis and simulation in packages", IEEE 1995.*

(Continued)

*Primary Examiner*—Leo Picard
*Assistant Examiner*—Kandasamy Thangavelu
(74) *Attorney, Agent, or Firm*—Osha Liang LLP

(57) ABSTRACT

A low-complexity, high accuracy model of a CPU anti-resonance system has been developed. The model includes a simulated load model, a simulated transistor that simulates the performance of a high frequency capacitor, and a simulated capacitor that simulates the performance of an intrinsic capacitance of a section of the microprocessor. All of the elements of the model are connected in parallel.

5 Claims, 6 Drawing Sheets

OTHER PUBLICATIONS

IEEE Transactions on Advanced Packaging, Aug. 1999, vol. 22, No. 3, pp. 284-291: "Power Distribution System Design Methodology and Capacitor Selection for Modern CMOS Technology", L. D. Smith, R. E. Anderson, D. W. Forehand, T. J. Pelc and T. Roy.

IEEE Transactions on Advanced Packaging, Aug. 1999, vol. 22, No. 3, pp. 240-248: "Modeling of Power Distribution Systems for High Performance Microprocessors", Dennis J. Herrell and Benjamin Beker.

Notification of Transmittal of the International Search Report (5 pages) for PCT/US02/09606, dated Aug. 12, 2003.

"Resonance and Damping in CMOS Circuits with On-Chip Decoupling Capacitance" as published in IEEE Transactions on Circuits and Systems-I: Fundamental Theory and Applications Author: Patrik Larsson vol. 45, No. 8, Aug. 1998 (pp. 849-858).

"Parasitic Resistance in an MOS Transistor Used as On-Chip Decoupling Capacitance" as published in IEEE Journal of Solid-State Circuits, vol. 32, No. 4, Apr. 1997 Author: Patrik Larsson (pp. 574-576).

"Power Supply Noise in Future IC's: A Crystal Ball Reading" as published in IEEE 1999 Custom Integrated Circuits Conference Author: P. Larsson (pp. 467-474).

* cited by examiner

LOW-COMPLEXITY, HIGH ACCURACY MODEL OF A CPU ANTI-RESONANCE SYSTEM

BACKGROUND OF INVENTION

1. Field of the Invention

The invention relates generally to circuitry design, more specifically, the invention relates to modeling of an anti-resonance circuit for a central processing unit.

2. Background Art

As today's computer systems operate at frequencies exceeding 1 GHz, the demands on internal power supplies also increase. For instance, as the technology is scaled smaller and faster, the power supply voltage must decrease. However, as the internal clock rates rise and more functions are integrated into microprocessors and application specific integrated circuits (ASICs), the total power consumed must increase. These demands require the internal power supply to respond quickly and reliably without significant overshoot, undershoot, or ringing of the supplied voltage.

Obviously, the design of the power system is critical to meeting these stringent requirements. A critical part of the design process is the modeling of the system. Typically, a model is used to simulate the system's performance so that design decisions can be made based on its results. The key questions in developing a model are: (1) the level of complexity it will entail; and (2) the degree of accuracy it will provide with its results. As a general rule, a more complex model has greater accuracy in its results. However, a complex model may take several days of operation just to simulate a few micro-seconds of system time.

FIG. 1 shows a prior art depiction of a central processing unit (CPU) power distribution system 10 with power system components that must be simulated by such a model. The main circuit board 12 itself is the central platform with the system power supply board 14 and system ground board 16 layered underneath. Attached to the surface of the board 10 is the circuit package 18 that holds the central processing unit 20 or "chip". Also shown are various components of the power system including: high-capacity ceramic capacitors 22; an air-core inductor 24; a regulating integrated circuit 26; switching transistors 28; a mid-capacity tantalum capacitor 30; and low-capacity electrolytic capacitors 32.

Of these components, the model of the chip 20 is the most difficult to develop. As the chips have achieved greater and greater speeds, these circuits have become more and more sensitive to the effects of parasitic inductance. The parasitic inductance can come from such sources as bond wires, IC package leads, and external supply lines that provide operating power. The problem with such characteristics is that they form a very high supply line impedance at a resonance frequency. This may lead to circuit oscillation 34 as shown in FIG. 2. In order to avoid such undesirable effects on circuit operation, the parasitic inductance must be suitably controlled in order to achieve a substantially non-oscillating waveform 36 as shown in FIG. 3.

Prior art methods of controlling parasitic inductance include connecting an external capacitor between the supply leads. This connection creates a passive bypass that decreases the supply line oscillation due to external inductances. However, it does not significantly reduce the oscillation caused by internal inductances. Another prior art method includes connecting an on-chip capacitor between the internal supply leads. The capacitor acts as a bypass in the same manner as an external capacitor. However, in order to be effective, the internal capacitor must be very large. This has the drawback of occupying a significant portion of the chip area. Consequently, this method is generally undesirable when minimization of the die area is of great importance.

Another prior art approach involves increasing the amount of charge stored or delivered to a given amount by actively increasing the voltage variation across their terminals with added on-chip de-coupling capacitance. FIG. 4 shows a schematic of this technique with resistance losses. In this method, fully charged capacitors 38 and 40 of equal value are stacked in series 42 across the on-chip Vdd/Vss grid. The capacitors serve as a voltage multiplier for the Vdd/Vss grid. The depleted voltage in each capacitor is Vdd/n, where n is the number of capacitor stacks. Conversely, the stacked capacitors will store charge from the Vdd/Vss grid until the terminals across the capacitors are fully at Vdd.

A capacitance amplification factor (G) represents the charge supplied to the grid by the switched capacitors normalized to the charge furnished by regular de-coupled capacitors given the same supply voltage variation. The amplification can be expressed as $G=(k+n-1)/(k*n^2)$, where n is the number of stacks and k is the voltage regulation tolerance. With each capacitor having a value (Cd), the equivalent unstacked capacitance of Cd*n is reduced to Cd/n upon stacking with a total stack voltage of Vdd*n.

FIG. 5a shows a schematic 44 of an implementation of the method of FIG. 4. The circuit shows mutually exclusive CMOS switches that configure the capacitors (C2) 46 and (C1) 48 to either be in the charging phase (shunt across Vdd/Vss) or in the discharging phase (in series with Vdd/Vss). The circuit has two sections: the $V_{ave}$ (average voltage) tracking loop 50 and the $V_{inst}$ (instant voltage) monitor and charge pump loop 52. The monitor and charge pump loop 52 is physically located on the chip. The switches are driven by two complementary drivers (comparators) 54 and 56. These drivers each provide two outputs with enough voltage offset to ensure minimal leakage through both charge and discharge switches during switching activity.

Instantaneous voltage supply variation ($V_{inst}$) is monitored by coupling the Vdd and Vss onto the comparator 56 input that is dynamically biased about a reference voltage ($V_{ave}$). $V_{ave}$ is a high-pass filtered version of the local ((Vdd−Vss))/2. Its low frequency cutoff clears the low end resonance range, but it also rejects the tracking of low-frequency disturbances that are not due to resonance. The coupled $V_{inst}$ feed the main negative feedback loop as charge is pumped in and out of the switched capacitors 46 and 48 coupled to the Vdd/Vss grid in an attempt to defeat the voltage variations. The compensated high frequency cutoff ensures stable loop response while also clearing the high end of the resonance range.

FIG. 5b shows the operation of the circuit shown in FIG. 5a. Specifically, the graph shows: a steady state when $V_{inst}=V_{ave}$; a discharging phase when $V_{inst}<V_{ave}$; and a charging phase when $V_{inst}>V_{ave}$. The high frequency and low frequency cutoffs are also shown for their respective phases.

The net result is that this analog circuit described herein senses when the supply is collapsing and then it acts by charging/discharging to ensure stability in the power supply. However, a model of such a package/chip anti-resonance circuit is needed that provides accurate results in an acceptable amount of simulation time.

SUMMARY OF INVENTION

In some aspects, the invention relates to an apparatus for simulating an anti-resonance circuit of a microprocessor, including a simulated load model, a simulated transistor that simulates at least one high frequency capacitance of the anti-resonance circuit, where the simulated transistor is connected in parallel with the simulated load model; and a simulated capacitor that simulates an intrinsic capacitance of a section of the microprocessor, where the simulated capacitor is connected in parallel with the simulated load model.

In other aspects, the invention relates to a method for simulating an anti-resonance circuit of a microprocessor, including simulating a load of the anti-resonance circuit, simulating at least one high-frequency capacitance in parallel with the simulated load, and simulating a section of the microprocessor's intrinsic capacitance in parallel with the simulated load.

In other aspects, the invention relates to an apparatus for modeling an anti-resonance circuit of a microprocessor, including a processor, memory, and instructions residing in the memory and executable by the processor to simulate a load of the anti-resonance circuit with a simulated resistor, simulate a high frequency capacitance of the anti-resonance circuit with a simulated transistor connected in parallel with the simulated resistor, and simulate an intrinsic capacitance in parallel with the simulated resistor.

Other aspects and advantages of the invention will be apparent from the following description and the appended claims.

BRIEF DESCRIPTION OF DRAWINGS

FIG. 5b shows a graph a the charging and discharging cycle of the circuit shown in FIG. 5a.

DETAILED DESCRIPTION

Figure 1:
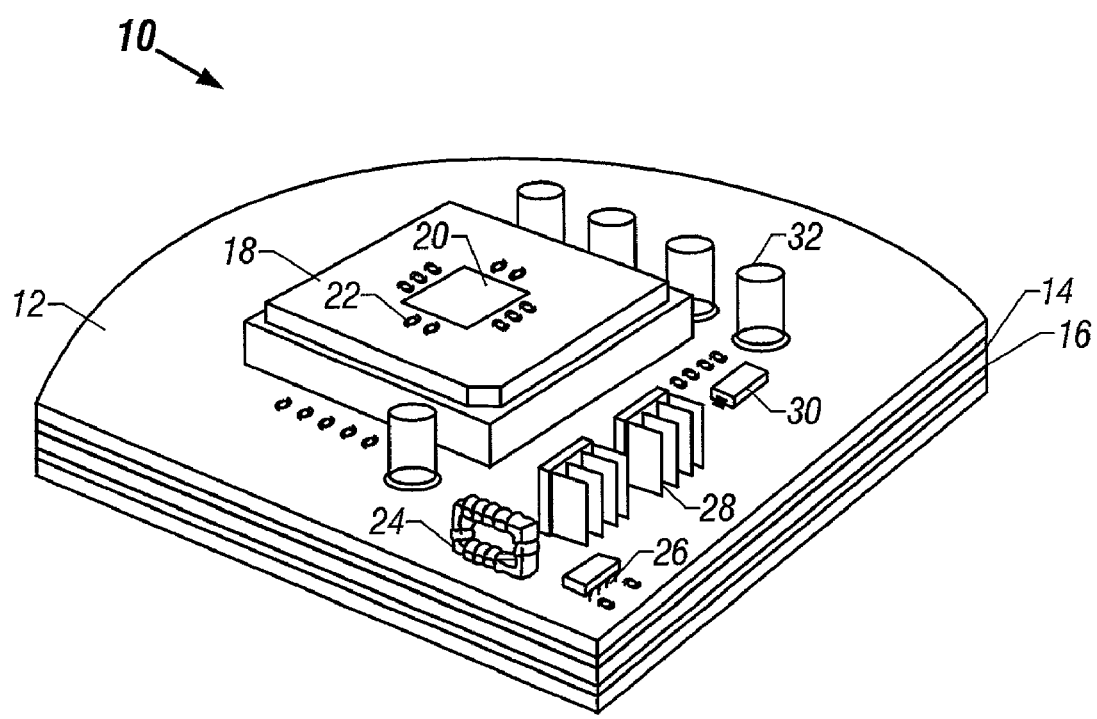
FIG. 1 shows a prior art depiction of a central processing unit (CPU) power distribution system with power system components.
Figure 2:
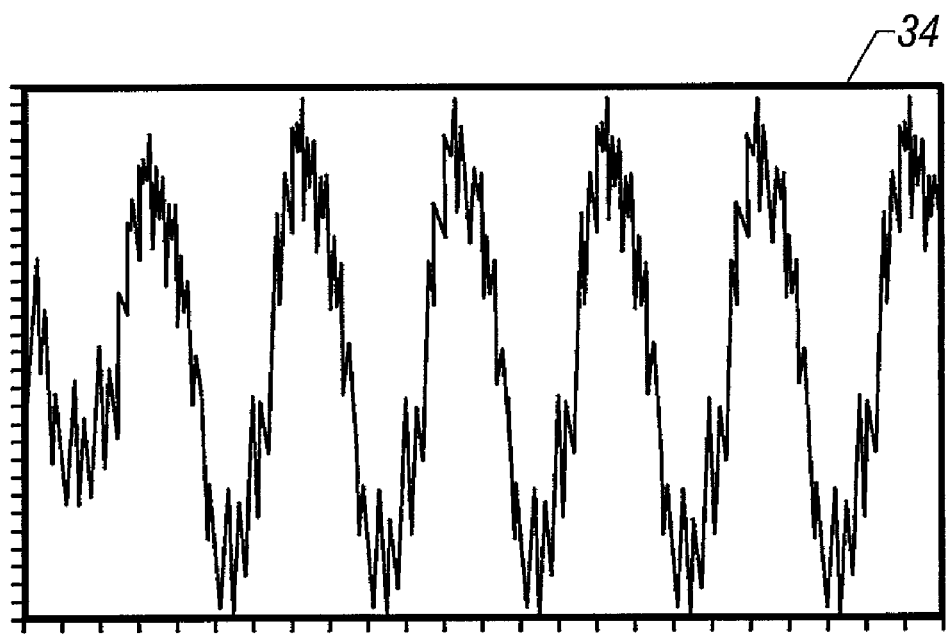
FIG. 2 shows a graph of an oscillating circuit.
Figure 3:
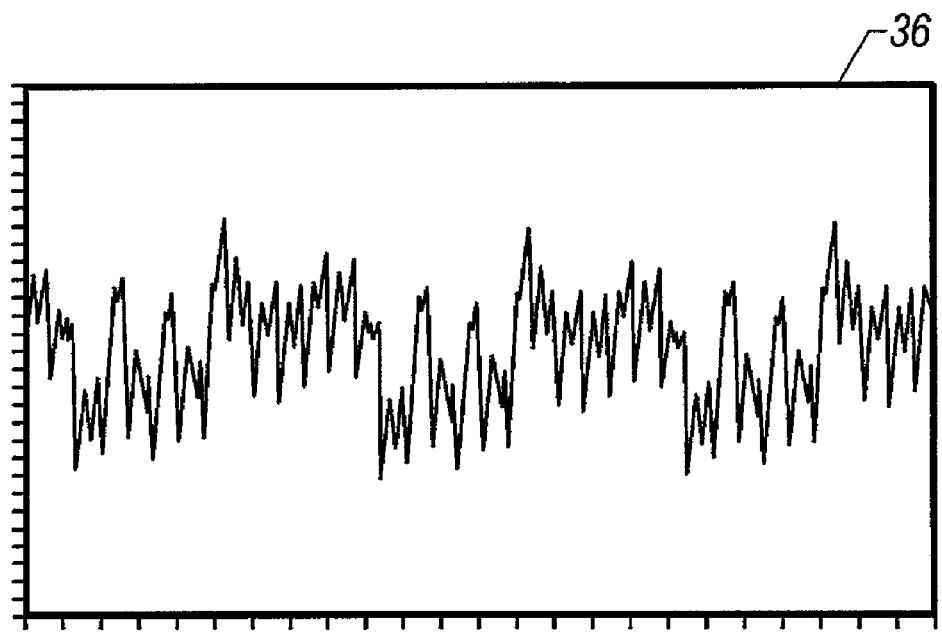
FIG. 3 shows a graph of a substantially non-oscillating circuit.
Figure 4:
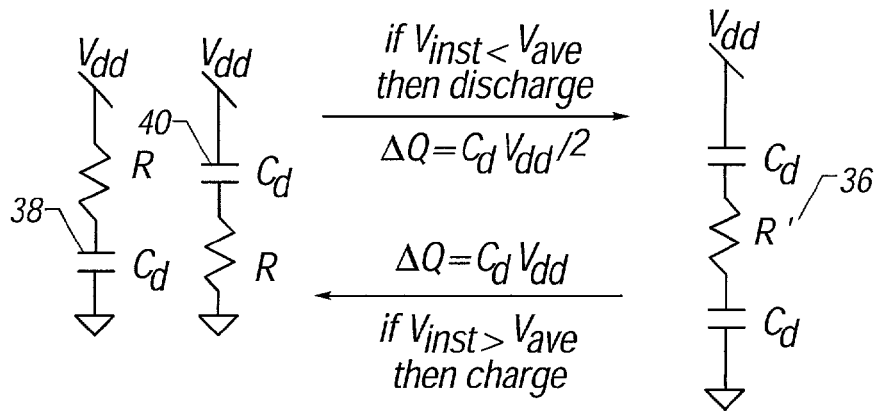
FIG. 4 shows a schematic of prior art stacked series capacitors.

Exemplary embodiments of the invention will be described with reference to the accompanying drawings. Like items in the drawings are shown with the same reference numbers.

Figure 6:
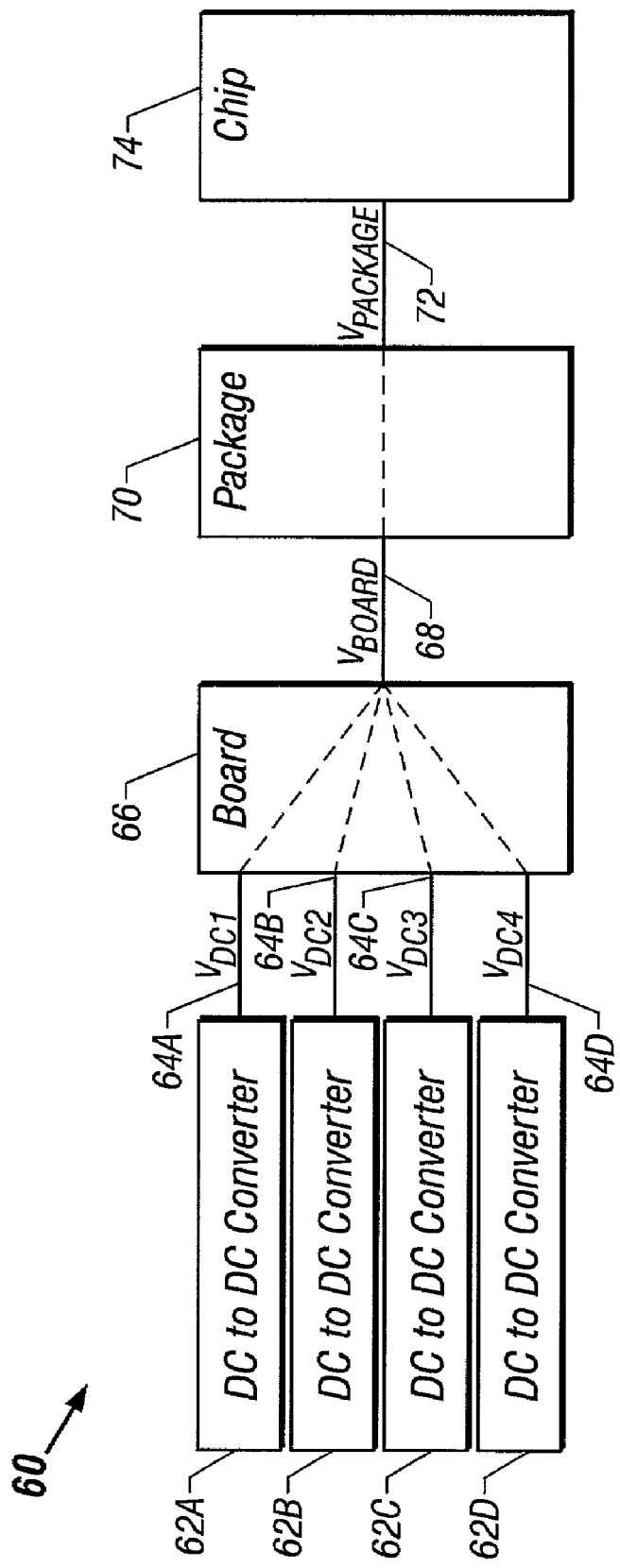
FIG. 6 shows a block diagram of a power distribution system model for a microprocessor based system in accordance with one embodiment of the present invention.

FIG. 6 shows a block diagram 60 of a model for a power system in accordance with one embodiment of the present invention. The model begins with four DC to DC converters 62a–62d that are connected to the board 66. The converters 62a–62d are each connected to the board 66 with a separate path or "via". These vias are labeled $V_{DC1}$ 64a, $V_{DC2}$ 64b, $V_{DC3}$ 64c, and $V_{DC4}$ 64d. Once the vias 64a–64d reach the board 66, they are combined into a single via labeled $V_{BOARD}$ 68. This path 68 connects the board 66 to the package 70. Finally, a via labeled $V_{PACKAGE}$ 72 connects the package 70 to the chip 74. Each of the blocks for the DC to DC converters 62a–62d, the board 66, the package 70, and the chip 74 represents a model of that specific component of the power system. Each of these models is made up of various circuitry devices that simulate the performance of the respective components. The selection of the specific values of these circuitry devices is accomplished by methods well known in the art. When models of the components 62a–62d, 66, 70, 74 are arranged and connected in the manner shown in FIG. 6, they will properly simulate the function and performance of the power system accurately and in an acceptable simulation timeframe.

While FIG. 6 shows four DC to DC converters 62a–62d, one board 66, one package 70, and one chip 74, it is fully intended that the scope of this invention covers embodiments with differing numbers of each of these components. For example, in a parallel processing environment, the system may have a plurality of package and chip blocks. The end result is that different arrangements and numbers of the component blocks are dependent upon the components present in the system to be modeled and are not limited to the embodiment shown here. Nevertheless, it is conceivable that multiple components (e.g., multiple chips in a parallel processing system) could be modeled by a single component block by simply adjusting the values of the circuitry devices in the respective block to represent the cumulative characteristics of multiple components.

Figure 7A:
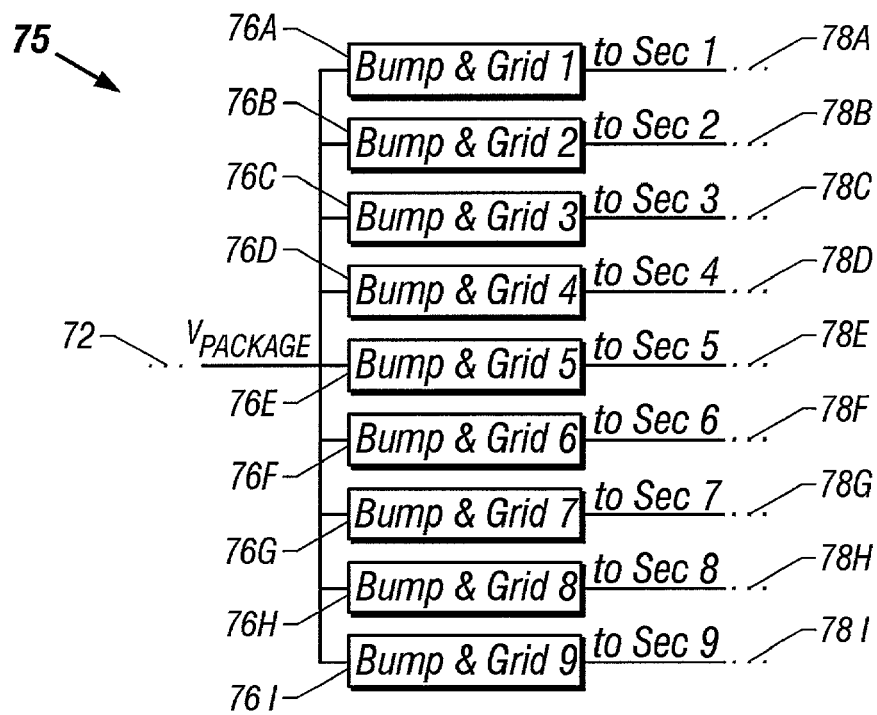
FIG. 7a shows a block diagram of bump and grid models of a chip model in accordance with one embodiment of the present invention.
Figure 7B:
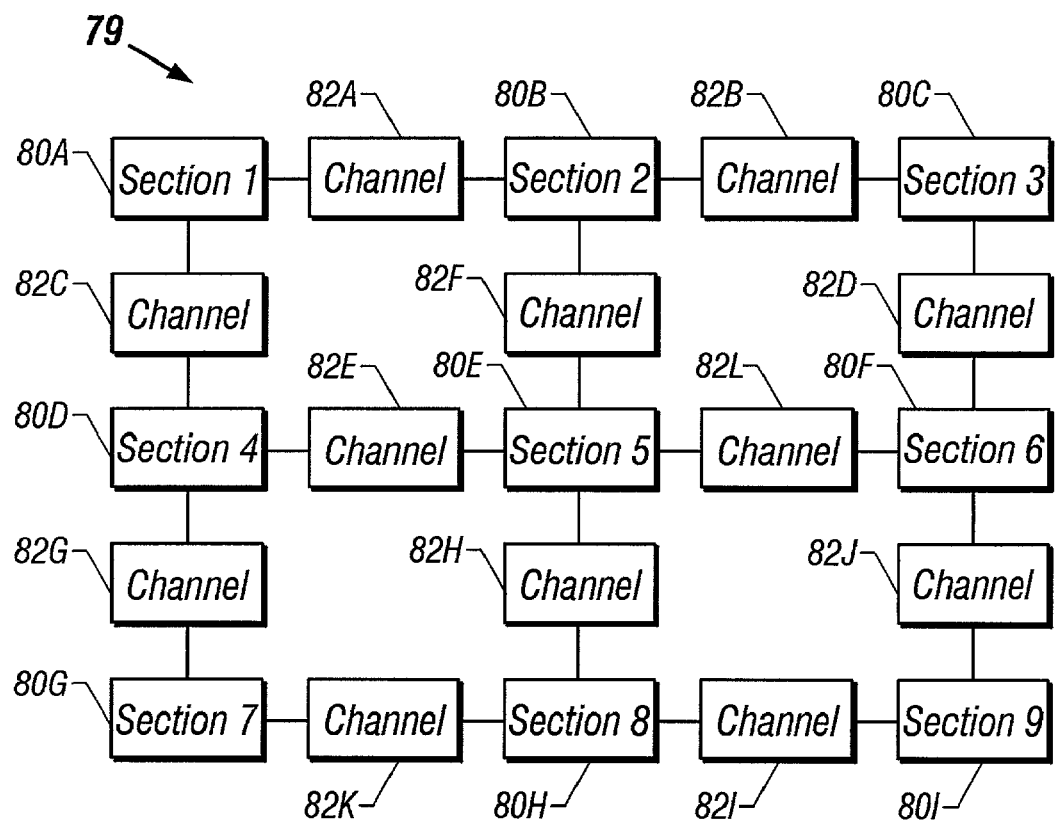
FIG. 7b shows a block diagram of channel models and section models of a chip model in accordance with one embodiment of the present invention.

FIGS. 7a and 7b show a block diagram 75 of a model of the power distribution system of a chip in accordance with one embodiment of the present invention. FIG. 7a shows the connection from the package via 72 is split into parallel paths that connect to nine separate models 76a–76i for the "bump and grid" "components of the chip. These components are generally the connections, circuit paths, etc. of the chip. Each of the bump and grid components 76a–76i is then connected by a via 78a–78i to a designated chip section model. FIG. 7b shows a block diagram 79 of an interconnecting grid of nine section models 80a–80i and ten routing channel models 82a–82l. Each section model 80a–80i is connected to other adjacent section models through the routing channel models 82a–82l. The nine sections are arranged in a three-by-three grid with the twelve channels serving as connections between each of the sections.

While FIGS. 7a and 7b show nine bump and grid models 76a–76i, nine section models 80a–80i, and twelve routing channels 82a–82l, it is fully intended that the scope of this invention covers embodiments with differing numbers of each of these components. For example, the chip could be represented by a four-by-four section model grid. The end result is that different arrangements and numbers of the component blocks shown in FIGS. 7a and 7b are dependent upon the components present in the system and are not limited to the embodiment shown here.

Figure 8:
FIG. 8 shows a circuit model for a section segment of a chip model in accordance with one embodiment of the present invention.

FIG. 8 shows a schematic 84 of a circuit model of a section model in accordance with one embodiment of the present invention. The section model, in general, represents a physical section of the chip. The model includes a load 86 that is connected to a transistor labeled $C_{LOCAL}$ 88 and a voltage-controlled capacitor labeled $C_{INTRINSIC}$ 90. All of these devices are connected together in parallel. The load 86 represents a load model for that section of the chip. The load model may be a voltage controlled resistor for AC simulations. The transistor $C_{LOCAL}$ 88 represents the local high frequency capacitors. The capacitor $C_{INTRINSIC}$ 90 represents the intrinsic transistor capacitance of the section of the chip. In FIG. 8, the values of each transistor 88, each load 86, and each capacitor 90 are selected to accurately simulate the performance of its specific modeled component.

Figure 9:
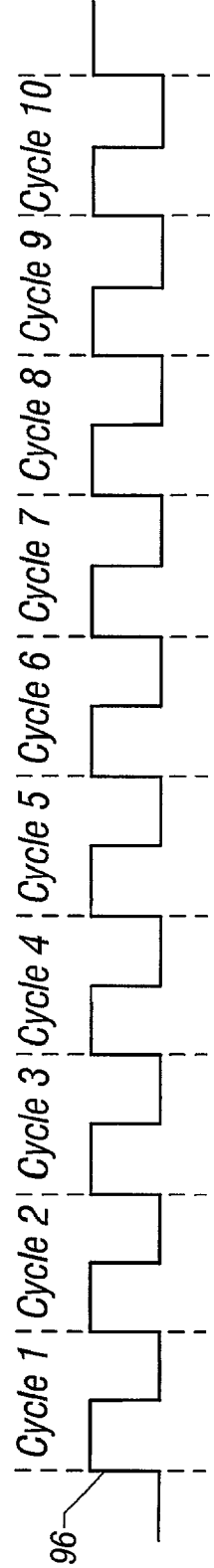
FIG. 9 shows a schematic of the load model of the chip in accordance with one embodiment of the present invention.

FIG. 9 shows a schematic 91 of a circuit model of a load of a chip. The load includes the representation of the anti-resonance circuit of the package/chip interconnection. The model represents the anti-resonance circuit with a voltage controlled resistor 92. The resistor 92 is used in AC simulations and AC sweeps (to find the resonant frequency of the circuit). This model runs orders of magnitude faster than a model that uses transistors. Also, it is easily scalable due to the lack of transistors. While the voltage controlled resistor 92 of the load simulates the anti-resonance circuit, it should be understood that its value could be adjusted to simultaneously simulate other parts of the load as well. As such, it should not be limited to the embodiment describe here, but instead its value should be determined by the components of the actual circuit to be modeled.

Figure 5A:
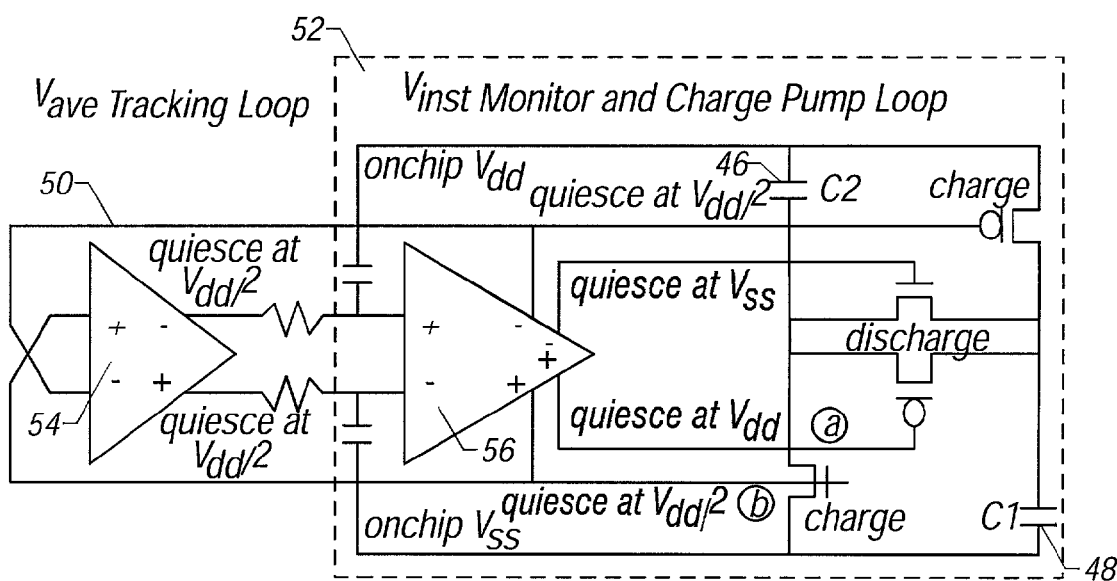
FIG. 5a shows a schematic of a prior art tracking loop and monitor charge pump loop.
Figure 5B:
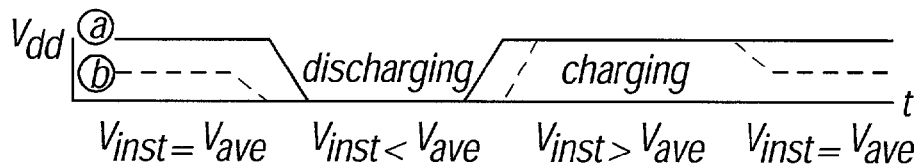
Figure 10:
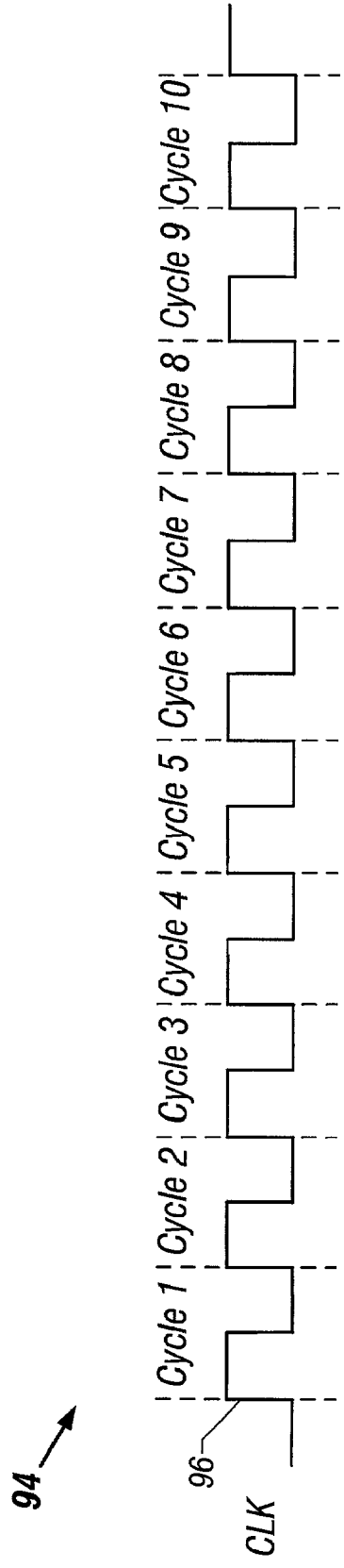
FIG. 10 shows a graph of a CPU clock cycle in accordance with one embodiment of the present invention.

In an actual anti-resonance circuit, such as shown by example in FIG. 5a, the circuit itself uses analog components to sense when the power supply is collapsing. Once this collapse begins, the circuit then begins its charging/discharging to stabilize the supply. In the model, this analysis of the power supply is simulated by assuming when the collapse of the supply occurs. In general, it has been found that the supply begins to collapse at the beginning or leading edge of the CPU clock cycle. FIG. 10 shows a graph of a CPU clock signal 94 and that is broken into multiple cycles. The leading edge 96 of the first cycle is an example of a point where simulation of the collapse of the supply could begin. The collapse of the supply on the leading edge of a clock cycle is due to all of the flip-flops, latches, and other data storage devices latching on this signal.

The resulting model represents an advantage in modeling of anti-resonance circuits of microprocessor chips by providing a low complexity model with an excellent simulation time. The model further provides flexibility in accurately modeling the system performance in AC analysis.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A computer implemented method for simulating an anti-resonance circuit of a section of a microprocessor, comprising:
   simulating a load of the anti-resonance circuit;
   simulating using a simulated transistor model, at least one high frequency capacitance of the anti-resonance circuit in parallel with the simulated load; and
   simulating using a simulated capacitor model, an intrinsic capacitance of the section of the microprocessor in parallel with the simulated load.

2. The method of claim 1, wherein the load is simulated with a simulated resistor.

3. The method of claim 2, wherein the simulated resistor is a simulated voltage controlled resistor.

4. The method of claim 1, wherein simulation of the anti-resonance circuit is synchronized with a simulated clock cycle.

5. The method of claim 4, wherein simulation of the anti-resonance circuit begins on a leading edge of the simulated clock cycle.

* * * * *